United States Patent
Genc

(10) Patent No.: US 9,461,037 B2
(45) Date of Patent: Oct. 4, 2016

(54) REDUCED GENERATION OF SECOND HARMONICS OF FETS

(71) Applicant: PEREGRINE SEMICONDUCTOR CORPORATION, San Diego, CA (US)

(72) Inventor: Alper Genc, San Diego, CA (US)

(73) Assignee: Peregrine Semiconductor Corporation, San Diego, CA (US)

( * ) Notice: Subject to any disclaimer, the term of this patent is extended or adjusted under 35 U.S.C. 154(b) by 149 days.

(21) Appl. No.: 14/174,755

(22) Filed: Feb. 6, 2014

(65) Prior Publication Data

US 2015/0222260 A1    Aug. 6, 2015

(51) Int. Cl.
*H01L 27/06* (2006.01)
*H03K 17/16* (2006.01)
*H01L 29/10* (2006.01)

(52) U.S. Cl.
CPC ....... *H01L 27/0629* (2013.01); *H01L 29/1083* (2013.01); *H03K 17/162* (2013.01); *H01L 2924/30105* (2013.01)

(58) Field of Classification Search
CPC ........... H01L 27/0629; H01L 29/1083; H01L 2924/30105
See application file for complete search history.

(56) References Cited

U.S. PATENT DOCUMENTS

| | | | |
|---|---|---|---|
| 7,910,993 B2 | 3/2011 | Brindle et al. | |
| 2006/0194558 A1* | 8/2006 | Kelly | 455/319 |
| 2007/0018247 A1* | 1/2007 | Brindle | H01L 29/78609 257/347 |
| 2012/0267719 A1* | 10/2012 | Brindle et al. | 257/348 |
| 2013/0009225 A1* | 1/2013 | Kocon | H01L 27/0629 257/296 |

* cited by examiner

*Primary Examiner* — Ha Tran T Nguyen
*Assistant Examiner* — Aaron Dehne
(74) *Attorney, Agent, or Firm* — Jaquez Land Greenhaus LLP; Martin J. Jaquez, Esq.; John Land, Esq.

(57) ABSTRACT

A structure and method for reducing second-order harmonic distortion in FET devices used in applications that are sensitive to such distortion, such as switching RF signals. The asymmetry of the drain-to-body capacitance Cdb and source-to-body capacitance Csb of a FET device are equalized by adding offsetting capacitance or a compensating voltage source.

6 Claims, 8 Drawing Sheets

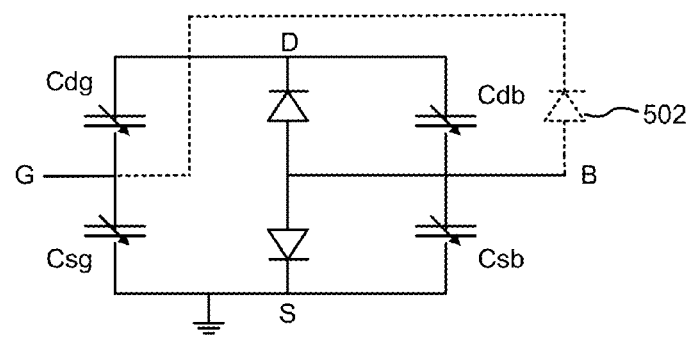
FIG. 5
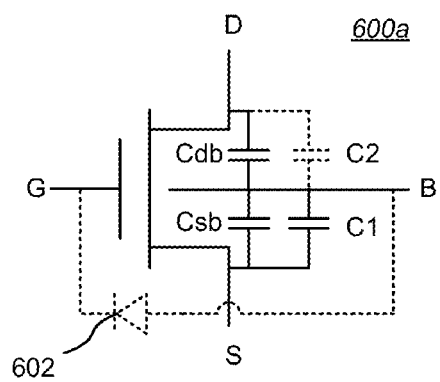 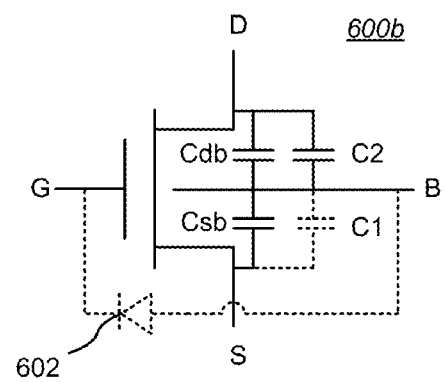
FIG. 6A        FIG. 6B

REDUCED GENERATION OF SECOND HARMONICS OF FETS

BACKGROUND

(1) Technical Field

This invention generally relates to electronic circuits, and more specifically to field effect transistor structures.

(2) Background

A field effect transistor (FET) employs a gate-modulated conductive channel between a source region and a drain region. Various types of FETs exist, including insulated gate FETs (IGFETs), of which the most common type are metal-oxide-semiconductor FETs (MOSFETs). MOSFETs having n-type or p-type channel conductivity are referred to as an "NMOSFET" or "PMOSFET", respectively.

FIG. 1 is a schematic diagram of a conventional prior art FET 100 with an optional body diode. Shown are the source S, drain D, and gate G. Also shown is body connection B to the body or substrate on which the FET is fabricated. As is well known, when a voltage is applied between the gate G and source S terminals of a FET, a generated electric field penetrates through the gate oxide to the transistor body B. As one example, for an enhancement mode MOSFET device, a positive bias voltage applied to the gate G creates a conductive channel in the channel region of the MOSFET body through which current passes between the source S and drain D. As another example, for a depletion mode MOSFET device, a conductive channel is present with a zero bias voltage applied to the gate G; varying the voltage applied to the gate G modulates the conductivity of the channel and thereby controls the current flow between the source S and drain D. Note that while the amount of current flow may be modulated continuously, another common use of a FET is as a simple binary switch having only "ON" and "OFF" states, where a signal either passes through the FET between the drain D and source S ("ON" state) or the signal is blocked (isolated) from passing between the drain D and source S ("OFF" state).

No matter what mode of operation a FET employs (i.e., enhancement mode or depletion mode), under some circumstances for a FET operated as a binary switch, when the FET is switched to an OFF-state with a nonzero gate bias voltage applied with respect to the source S and drain D, an accumulated charge may occur under the gate G. When such a FET is in an OFF-state, and when carriers are present in the channel region having a polarity that is opposite to the polarity of the source and drain carriers, the FET is defined herein as operating in an "accumulated charge regime".

As described in U.S. Pat. No. 7,910,993 B2, issued Mar. 22, 1011, entitled "Method and Apparatus for use in Improving Linearity of MOSFET'S using an Accumulated Charge Sink" and assigned to the assignee of the present invention, when used in certain circuit implementations, conventional MOSFETs operating in the accumulated charge regime exhibit undesirable non-linear characteristics that adversely impact circuit performance. For example, accumulated charge adversely affects the linearity of OFF-state silicon-on-insulator (SOI) and silicon-on-sapphire (SOS) MOSFETs, and more specifically, accumulated charge adversely affects the linearity of capacitances that contribute to the drain-to-source capacitance (Cds). For such MOSFETs operating in an OFF-state, Cds is referred to as Coff. For bias conditions where the gate bias Vg is provided by a circuit having an impedance that is large compared to the impedances of the contributing capacitances to Coff, such contributing capacitances adversely affect harmonic distortion, intermodulation distortion, and other performance characteristics of such circuits.

SOI and SOS MOSFETs are often used in applications in which operation within the accumulated charge regime adversely affects MOSFET performance. Unless the accumulated charge is removed or otherwise controlled, it detrimentally affects performance of such MOSFETs under certain operating conditions. As described in U.S. Pat. No. 7,910,993 B2 referenced above, one way of controlling or removing accumulated charge in such MOSFET's is by coupling the body B to the gate G through a diode 102, as shown in FIG. 1.

However, while this solution significantly reduces harmonic distortion and intermodulation distortion in MOSFET's, adding the diode 102 does not eliminate harmonic distortion in such devices. Second-order harmonics, for example, adversely affect radio frequency (RF) signals in particular. For example, FIG. 2 is a plot of measurements of second harmonic power versus drain to source voltage Vds for four configurations of prior art RF FETs (configured as a "stack" of one FET, in a shunt configuration OFF state): even number of gate "fingers" and no body-to-gate diode (plot curve 202); an even number of gate "fingers" and a body-to-gate diode (plot curve 204); an odd number of gate "fingers" and no body-to-gate diode (plot curve 206); and an odd number of gate "fingers" and a body-to-gate diode (plot curve 208). The number of "fingers" refers to physical configurations of the FETs as shown in FIG. 3 and FIG. 4.

FIG. 3 shows a top-down layout view of a first prior art FET 300 in which source 32 and drain 34 regions are interdigitated as shown on a substrate or body 36. An overlying gate layer 38 with an even number of "fingers" (four are shown by way of example) is situated between the interdigitated projections of the source 32 and drain 34 regions. When biased by an appropriate voltage level, the gate layer 38 modulates the conductive channels between the source 32 and drain 34 regions. Also shown is a drain-to-body tie 310, discussed below.

FIG. 4 shows a top-down schematic view of a second prior art FET 400 in which source 402 and drain 404 regions are interdigitated as shown on a substrate or body 406. An overlying gate layer 408 with an odd number of "fingers" (three are shown by way of example) is situated between the interdigitated projections of the source 402 and drain 404 regions. As in FIG. 3, when biased by an appropriate voltage level, the gate layer 408 modulates the conductive channels between the source 402 and drain 404 regions. Also shown is a drain-to-body tie 410, discussed below.

Referring back to FIG. 2, each plot curve 202-208 shows the drain-to-body capacitance Cdb and source-to-body Csb capacitance (impedance) asymmetry for an associated configuration. During normal operation with a FET in an OFF state, Vds=0V DC. It is desirable to have the lowest second harmonic ("2fo") value at the vertical axis of Vds=0V; in the illustrated example, plot curve 208 has that characteristic at crossing-point 210. The plots of 2fo values across different Vds values show that there exists a value of Vds (effectively an offset voltage) for each FET configuration where the effective capacitances of Cdb and Csb are equivalent (that is, at the nadir of each plot curve). FET devices with an odd number of gate fingers have lower capacitance asymmetry for Csb and Cdb, and accordingly better harmonic characteristics. Thus, the plot curves 206, 208 for devices with an odd number of gate fingers have Vds=0V crossing-points with lower 2fo values than do the plot curves 202, 204 for devices with an even number of gate fingers. However, the use of an odd number of gate fingers does not totally cancel the asymmetry of Csb and Cdb.

More specifically, because of the drain-to-body ties 310, 410 in FIG. 3 and FIG. 4, respectively, for m even fingers, Cdb is proportional to (m−1) times the capacitance of the device junction per finger, plus the capacitance of the drain-body coupling, whereas Csb is proportional to (m−2) times the capacitance of the device junction per finger. Form odd fingers, Cdb is proportional to (m−1) times the capacitance of the device junction per finger, plus the capacitance of the drain-body coupling, whereas Csb is proportional to only (m−1) times the capacitance of the device junction per finger. As should be apparent, even with an odd number of gate fingers, Csb≠Cdb.

The addition of a body-to-gate diode in a FET device improves the suppression of harmonics. Thus, the plot curves 204, 208 for devices with a body-to-gate diode show greater harmonic suppression than do the plot curves 202, 206 for devices without such a diode. However, the addition of a body-to-gate diode does not completely remove the $2^{nd}$ harmonic. Even the combination of odd gate fingers and a body-to-gate diode (curve 208) does not eliminate the second-order harmonic. Moreover, existing implementations of FET's with a body-to-gate diode can actually cause greater Csb, Cdb asymmetry.

Accordingly, there is a need for a structure and method for reducing second-order harmonic distortion in FETs used in applications, such as RF signals, that are sensitive to such distortion. The present invention addresses that need.

SUMMARY OF THE INVENTION

The invention encompasses a structure and method for reducing second-order harmonic distortion in FETs used in applications that are sensitive to such distortion, such as switching RF signals. Measurements of FET architectures used in such applications has shown that the capacitance between drain and body is not equal to the capacitance between source and body for various device layout geometries, and that such asymmetry in capacitance modulates applied RF signals and results in an increase in second-order harmonics. Embodiments of the present invention include circuits and related layout geometries and corresponding methods for balancing out such asymmetry, thus reducing second-order harmonic distortion.

In one embodiment of a FET in accordance with an aspect of the invention, the asymmetry of the drain-to-body capacitance Cdb and source-to-body capacitance Csb is equalized by adding at least one of a counter-balancing capacitance C1 between the source S and the body B or a counter-balancing capacitance C2 between the drain D and the body B. The capacitance value of C1 and/or C2 is sized to equalize the measured values of Cdb and Csb for a particular FET device layout geometry and size. An optional body-to-gate diode may be added as well.

The added offsetting capacitance C1 may be implemented as a distinct capacitor structure, or by re-arranging the geometry, size, and/or device materials of a FET (i.e., C1 is implemented as a "purposeful" parasitic capacitance) so as to equalize the inherent parasitic capacitances of the device such that Csb+C=Cdb.

Similarly, the added offsetting capacitance C2 may be implemented as a distinct capacitor structure, or by re-arranging the geometry, size, and/or device materials of a FET (i.e., C2 is implemented as a "purposeful" parasitic capacitance) so as to equalize the inherent parasitic capacitances of the device such that Cdb+C2=Csb.

In practice, it is often difficult to add C1 or C2 to a device without also adding a second capacitance C2 or C1, respectively. This is acceptable if C1 and C2 are sized (e.g., by having more or less metallization) such that Csb+C1=Cdb+C2.

In another embodiment of a FET in accordance with an aspect of the invention, the asymmetry of the parasitic drain-to-body capacitance Cdb and source-to-body capacitance Csb is equalized by adding a bias voltage source Vds to counter-balance the difference in charge accumulated by Cdb and Csb. The voltage provided by Vds will depend on the device layout geometry and size for a particular FET. An optional body-to-gate diode may be added as well.

The details of one or more embodiments of the invention are set forth in the accompanying drawings and the description below. Other features, objects, and advantages of the invention will be apparent from the description and drawings, and from the claims.

DESCRIPTION OF THE DRAWINGS

FIG. 5 is a schematic diagram of a FET modeled in terms of internal capacitances and diode structures.

FIG. 6A is a first embodiment of a FET of the type shown in FIG. 1 and FIG. 5 modified in accordance with an aspect of the invention.

FIG. 6B is a second embodiment of a FET of the type shown in FIG. 1 and FIG. 5 modified in accordance with an aspect of the invention.

Like reference numbers and designations in the various drawings indicate like elements.

DETAILED DESCRIPTION OF THE INVENTION

The invention encompasses a structure and method for reducing second-order harmonic distortion in FETs used in applications that are sensitive to such distortion, such as switching RF signals. Measurements of FET architectures used in such applications have shown that the capacitance between drain and body is not equal to the capacitance between source and body for various device layout geometries, and that such asymmetry in capacitance modulates applied RF signals and results in an increase in second-order harmonics. Embodiments of the present invention include circuits and related layout geometries and corresponding methods for balancing out such asymmetry, thus reducing second-order harmonic distortion.

FIG. 5 is a schematic diagram of a FET 500 modeled in terms of internal capacitances and diode structures. Shown are gate G, drain D, source S, and body B nodes, as well as an optional body-to-gate diode 502. Measurements of the inherent parasitic drain-to-gate capacitance Cdg and source-to-gate capacitance Csg for a variety of device layout geometries shows that the two capacitances are essentially equal, and are dependent on the number of gate fingers m, device geometry and size, and device materials. The parasitic drain-to-body capacitance Cdb and source-to-body capacitance Csb are also dependent on the number of gate fingers m, but differ by the capacitance caused by parasitic drain-to-body coupling, Cdbc, or source-to-body coupling, Csbc, that arises from the particular layout geometry and size of a FET device (in addition, if m is even, Csb will vary even more from Cdb). The exact values of Cdb and Csb for a particular device are determined empirically or by careful modeling of the device layout. Accordingly, offsetting the asymmetry in capacitances for Cdb and Csb will reduce second order harmonic distortion in FETs, with the goal being to add sufficient compensating capacitance or voltage such that the difference between the total drain-to-body capacitance Cdb and source-to-body capacitance Csb after compensation is essentially zero.

Figure 1:
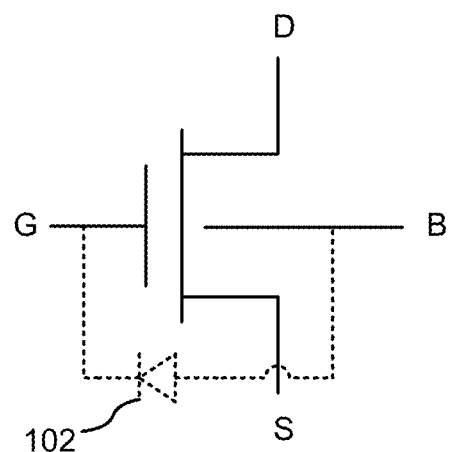
FIG. 1 is a schematic diagram of a conventional prior art FET with an optional body diode.

FIG. 6A is a first embodiment of a FET 600a of the type shown in FIG. 1 and FIG. 5 modified in accordance with an aspect of the invention. In this embodiment, the layout-dependent drain-to-body capacitance Cdb is greater than the source-to-body capacitance Csb. This asymmetry is equalized by connecting at least a counter-balancing capacitance C1 between the source S and the body B. An optional body-to-gate diode 602 is shown as well. The capacitance value of C1 is sized to equalize the measured values of Cdb and Csb for a particular FET device layout geometry and size such that Csb+C1=Cdb.

FIG. 6B is a second embodiment of a FET 600b of the type shown in FIG. 1 and FIG. 5 modified in accordance with an aspect of the invention. In this embodiment, the layout-dependent source-to-body capacitance Csb is greater than the drain-to-body capacitance Cdb. This asymmetry is equalized by connecting at least a counter-balancing capacitance C2 between the drain D and the body B. An optional body-to-gate diode 602 is shown as well. The capacitance value of C2 is sized to equalize the measured values of Csb and Cdb for a particular FET device layout geometry and size such that Cdb+C2=Csb.

In both FIG. 6A and FIG. 6B, the added offsetting capacitance may be implemented as a distinct capacitor structure, as described more fully below. However, the added offsetting capacitance may also be implemented by re-arranging the geometry, size, and/or device materials of a FET so as to equalize the inherent parasitic capacitances of the device (i.e., the offsetting capacitance is implemented as a "purposeful" parasitic capacitance). The added capacitance value is generally less than about 1 pF in capacitance, and more typically in the range of 1-100 fF.

In practice, it is often difficult to add an offsetting capacitance to the source S or drain D side of a device (e.g., by adding an additional metallization layer as part of a capacitive element) without also creating a parasitic capacitance between the body B and the other side of the device, as shown in FIG. 6A (parasitic capacitor C2) and FIG. 6B (parasitic capacitor C2). This is acceptable if the two capacitors are sized with respect to each other (e.g., by having more or less metallization and thus more or less capacitance) such that Csb+C1=Cdb+C2.

Figure 7:
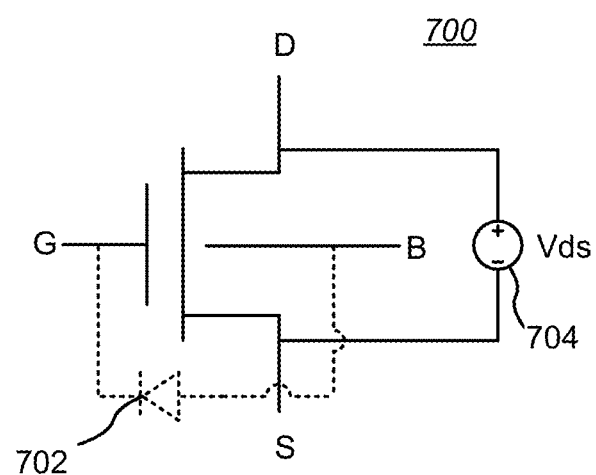
FIG. 7 is a third embodiment of a FET in accordance with an aspect of the invention.

FIG. 7 is a third embodiment of a FET 700 in accordance with an aspect of the invention, including an optional body-to-gate diode 702. In this embodiment, the asymmetry of the parasitic drain-to-body capacitance Cdb and source-to-body capacitance Csb of FIG. 5 (not shown in FIG. 7) is equalized by adding a bias voltage source Vds 704 to counter-balance the difference in charge accumulated by Cdb and Csb. The voltage provided by Vds will depend on the device layout geometry and size for a particular FET, but would typically be in the range of 10's to 100's of millivolts.

Figure 8A:
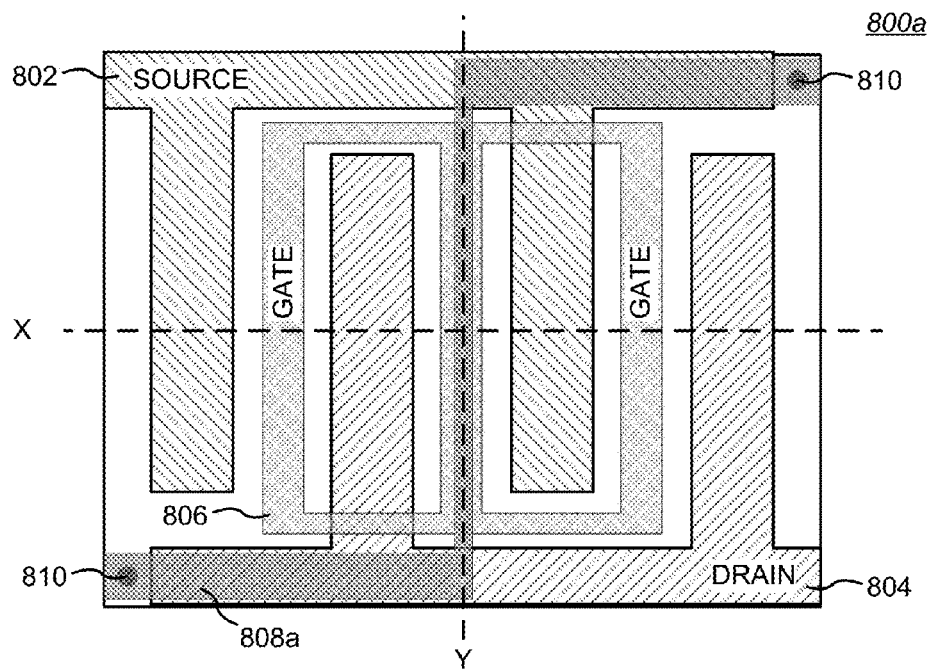
FIG. 8A shows a top-down layout view of a FET having a balanced drain-to-body and body-to-source capacitive layer in accordance with a first example of the present invention.

The circuits shown in FIG. 6A and FIG. 6B are relatively easy to implement in a variety of ways. For example, FIG. 8A shows a top-down layout view of a FET 800a having an added drain-to-body and body-to-source capacitive layer in accordance with a first example embodiment of the present invention. The source region 802, the drain region 804, and the gate layer 806 are all formed in conventional fashion. In addition, a conductive layer 808a is added above and insulated from the source 802 and drain 804 regions and coupled to the body of the FET 800 at connection nodes 810.

In FIG. 8A, the added conductive layer 808a forms capacitive structure where the layer crosses the source and drain regions such that the capacitive structures correspond to capacitors C1 and C2 in FIG. 6A and FIG. 6B. The different extents (e.g., width, length, and location) of the conductive layer 808a are sized to equalize the difference between the parasitic drain-to-body capacitance Cdb and source-to-body capacitance Csb of the device. In addition, it has been found to be particularly beneficial if the conductive layer 808a is arrayed symmetrically with respect to the X-Y axes of the device structure (see, e.g., the axes shown in FIG. 8a). However, the conductive layer extents need not be perfectly equal; for example, the width of the conductive layer 808a over the source region 810 may vary somewhat from the width of the conductive layer 808a over the drain region 802 if different offsetting capacitance values are needed.

Figure 8B:
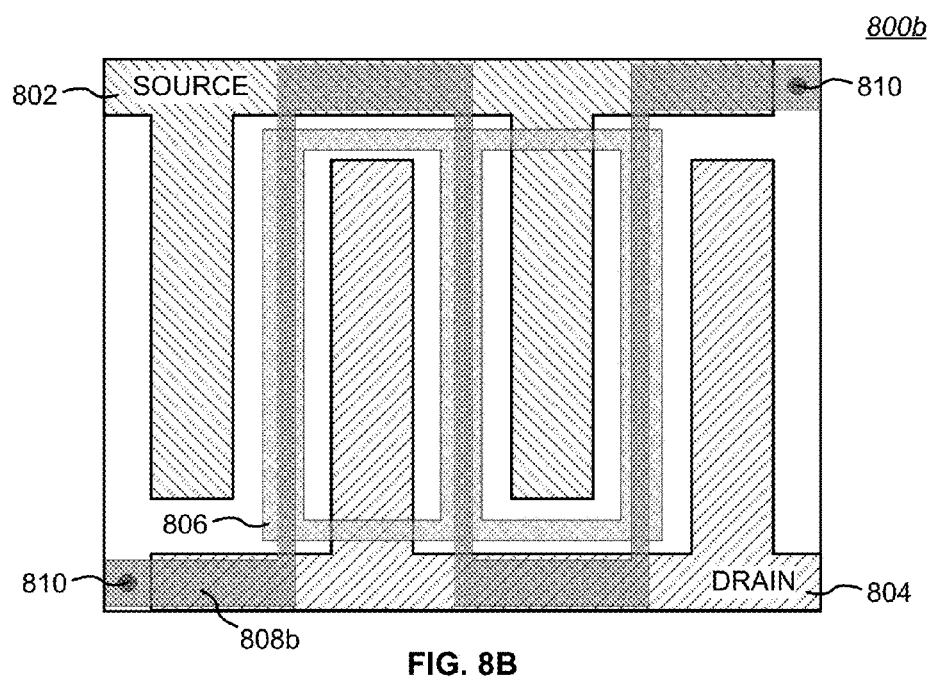
FIG. 8B shows a top-down layout view of a FET having a balanced drain-to-body and body-to-source capacitive layer in accordance with a second example of the present invention.

As another example of an implementation of the circuits shown in FIG. 6A and FIG. 6B, FIG. 8B shows a top-down layout view of a FET 800 having an added drain-to-body and body-to-source capacitive layer in accordance with a second example embodiment of the present invention. As in FIG. 8A, the source region 802, the drain region 804, and the gate layer 806 are all formed in conventional fashion. In addition, a conductive layer 808b is added above and insulated from the source 802 and drain 804 regions and coupled to the body of the FET 800 at connection nodes 810.

Figure 8C:
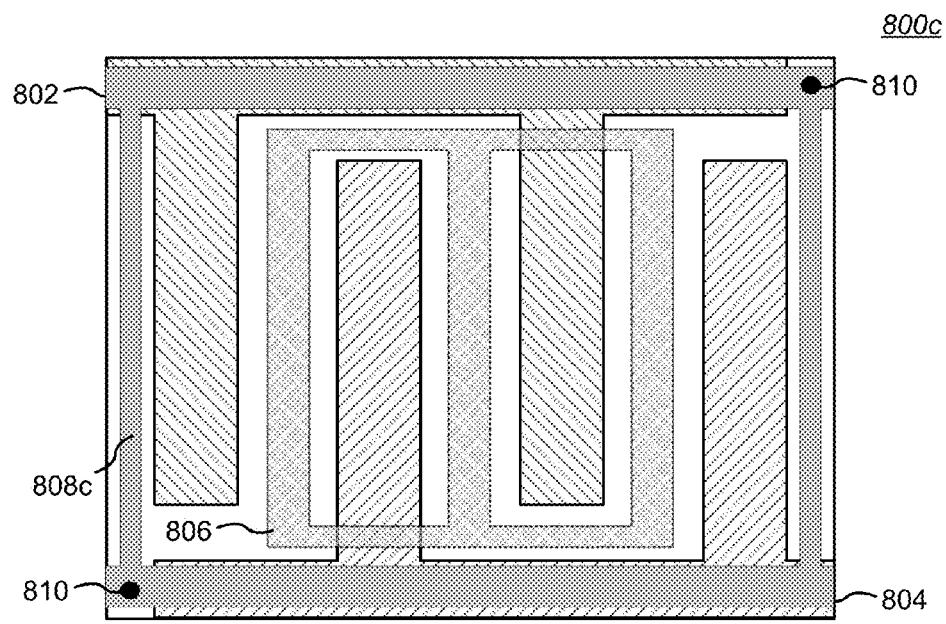
FIG. 8C shows a top-down layout view of a FET having a balanced drain-to-body and body-to-source capacitive layer in accordance with a third example of the present invention.
Figure 8D:
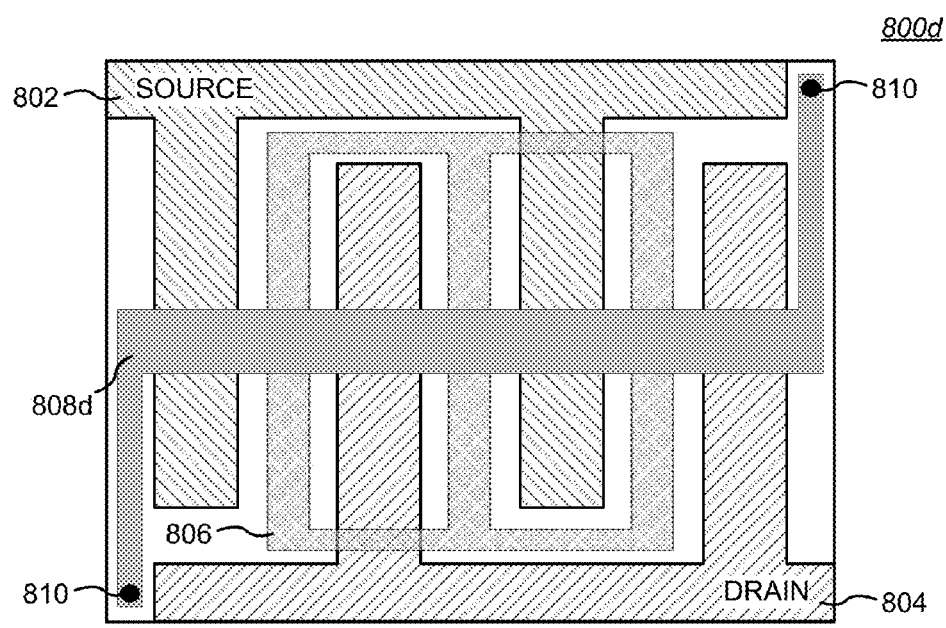
FIG. 8D shows a top-down layout view of a FET having a balanced drain-to-body and body-to-source capacitive layer in accordance with a fourth example of the present invention.

FIG. 8C shows a top-down layout view of a FET 800c having an added drain-to-body and body-to-source capacitive layer in accordance with a third example embodiment of the present invention. A conductive layer 808c is added above and insulated from the source 802 and drain 804 regions and coupled to the body of the FET 800 at connection nodes 810. Similarly, FIG. 8D shows a top-down schematic view of a FET 800d having an added drain-to-body and body-to-source capacitive layer in accordance with a fourth example embodiment of the present invention. A conductive layer 808d is added above and insulated from the source 802 and drain 804 regions and coupled to the body of the FET 800 at connection nodes 810.

As in FIG. 8A, in FIGS. 8B-8D, the added conductive layers 808b-808d form capacitive structures where they cross the source and drain regions such that the capacitive structures correspond to capacitors C1 and C2 in FIG. 6A and FIG. 6B. The different extents (e.g., width, length, and location) of the conductive layers 808b-808d are sized to equalize the difference between the parasitic drain-to-body capacitance Cdb and source-to-body capacitance Csb of the device. In addition, it has been found to be particularly beneficial if the conductive layers 808b-808d are arrayed symmetrically with respect to the X-Y axes of the device structure (see, e.g., the axes shown in FIG. 8A). As noted above, the extents of the conductive layers 808b-808d need not be perfectly equal.

Figure 9:
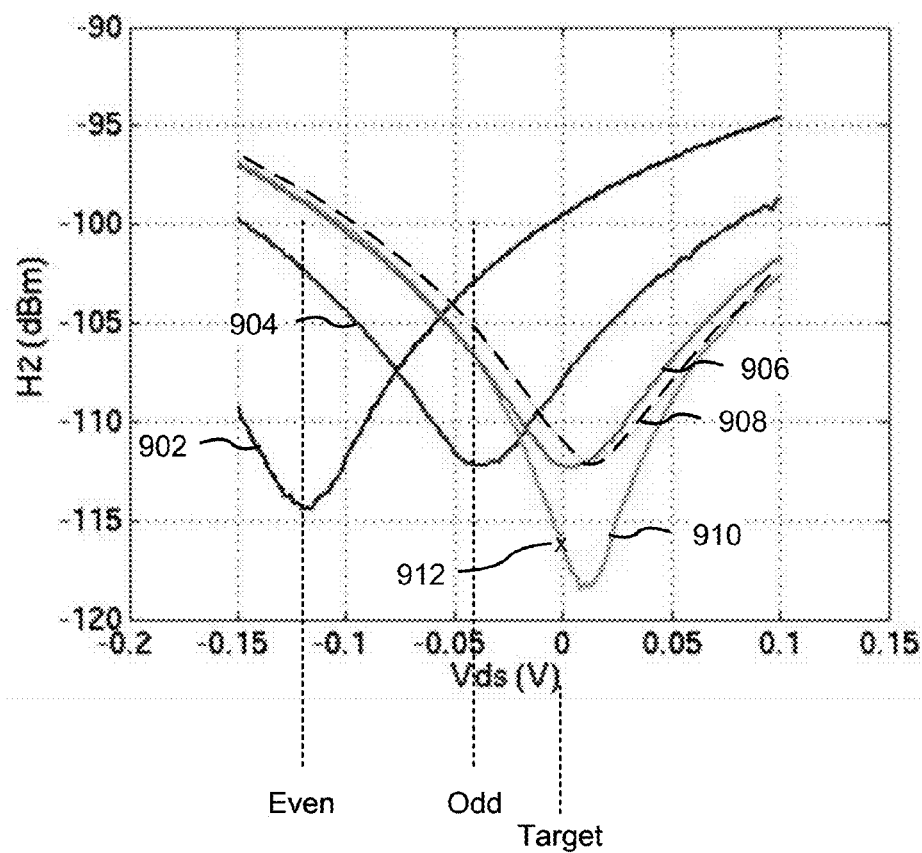
FIG. 9 is a plot of measurements of second harmonic power versus drain to source voltage Vds for three configurations of RF FETs configured in accordance with aspects of the invention, compared against two configurations of prior art RF FETs.

FIG. 9 is a plot of measurements of second harmonic power versus drain to source voltage Vds for three configurations of RF FETs configured in accordance with aspects of the invention, compared against two configurations of prior art RF FETs (configured as a "stack" of one FET, in a shunt configuration OFF state in all cases): a prior art configuration having an even number of gate "fingers" and no body-to-gate diode (plot curve 902); a prior art configuration having an odd number of gate "fingers" and no body-to-gate diode (plot curve 904); a configuration in accordance with the embodiment shown in FIG. 8A having no body-to-gate diode (plot curve 906); a configuration in accordance with the embodiment shown in FIG. 8B having no body-to-gate diode (plot curve 908); and a configuration in accordance with the embodiment shown in FIG. 8B having a body-to-gate diode (plot curve 910).

Figure 2:
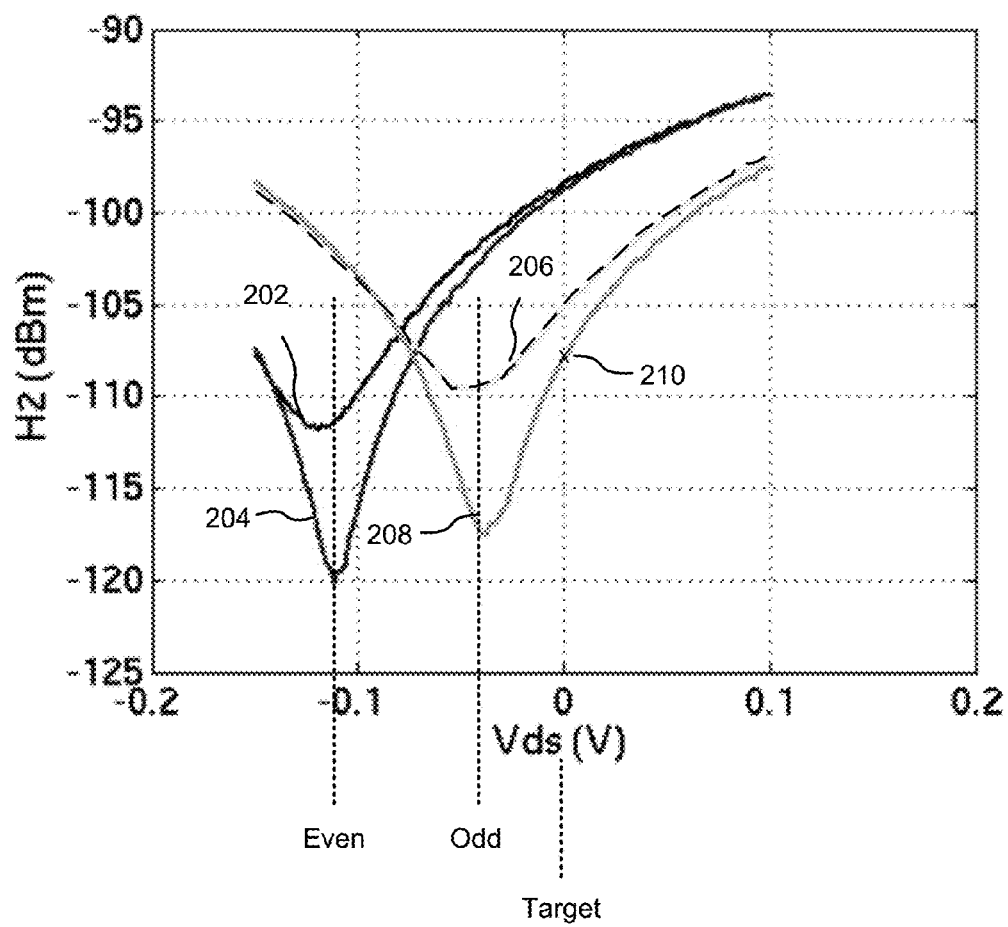
FIG. 2 is a plot of measurements of second harmonic power versus drain to source voltage Vds for four configurations of prior art RF FETs.
Figure 3:
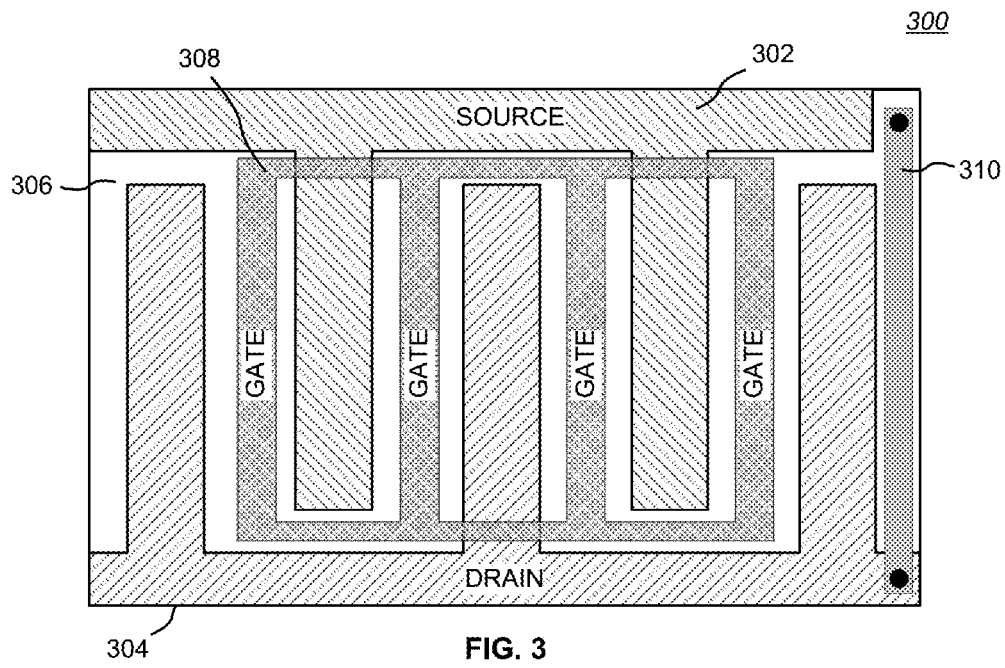
FIG. 3 shows a top-down layout view of a first prior art FET in which source and drain regions are interdigitated as shown on a substrate or body.
Figure 4:
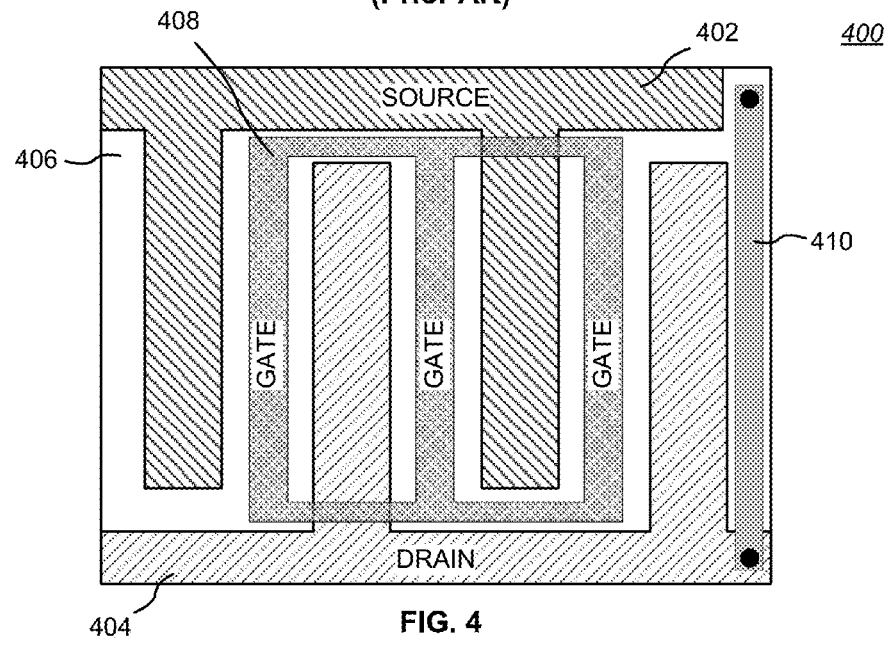
FIG. 4 shows a top-down layout view of a second prior art FET in which source and drain regions are interdigitated as shown on a substrate or body.

As with FIG. 2, the best performance for a FET device in terms of second harmonic distortion is the device having the lowest second harmonic ("2fo") value at the vertical axis of Vds=0V; in the illustrated example, plot curve 910 has that characteristic at crossing-point 912. The measurements shown in FIG. 9 show that all three FET configurations (represented by plot curves 906-910) utilizing the circuits shown in FIG. 6A and FIG. 6B substantially reduce second-order harmonic distortion compared to the prior art FET configurations (represented by plot curves 902 and 904). Further, measurements show that such reduction or elimination is accomplished essentially without any adverse effect on power handling, OFF-state third harmonics, or ON-state harmonics.

Another aspect of the invention includes a method for reducing second-order harmonic distortion in FET devices, including the steps of:

STEP 1: providing a field effect transistor device having a drain, a source, and a gate arranged on a body such that the gate modulates a conductive channel between a source region and a drain region; and STEP 2: providing capacitance coupled to the body and at least one of the source or drain and sized to set the total capacitance from the source to the body to be essentially equal to the total capacitance from the drain to the body.

Yet another aspect of the invention includes a method for reducing second-order harmonic distortion in FET devices, including the steps of:

STEP 1: providing a field effect transistor device having a drain, a source, and a gate arranged on a body such that the gate modulates a conductive channel between a source region and a drain region; and STEP 2: providing a voltage source coupled to the source and drain and configured at a voltage level sufficient to equalize the difference in the total capacitance from the source to the body with respect to the total capacitance from the drain to the body.

A number of embodiments of the invention have been described. It is to be understood that various modifications may be made without departing from the spirit and scope of the invention. For example, some of the steps described above may be order independent, and thus can be performed in an order different from that described. It is to be understood that the foregoing description is intended to illustrate and not to limit the scope of the invention, which is defined by the scope of the following claims, and that other embodiments are within the scope of the claims.

What is claimed is:

1. A field effect transistor device having reduced second-order harmonic distortion, including:
   (a) a drain region, a source region, and a gate arranged on a body such that the gate modulates a conductive channel between the source region and the drain region; and
   (b) an added capacitive layer overlaying but insulated from the source region and the drain region, and directly coupled to the body and capacitively coupled to the source region and the drain region, and sized to set the total capacitance from the source region to the body to be essentially equal to the total capacitance from the drain region to the body, wherein the added capacitive layer is arrayed symmetrically with respect to the X-Y axes of the field effect transistor device.

2. The field effect transistor device of claim 1, wherein the added capacitive layer has a capacitance of less than about 1 pF.

3. A field effect transistor device having reduced second-order harmonic distortion, including:
   (a) a drain, a source, and a gate arranged on a body such that the gate modulates a conductive channel between a source region and a drain region; and
   (b) a bias voltage source coupled between the source and drain and configured at a voltage level sufficient to counter-balance the difference in charge accumulated by the capacitance from the source to the body with respect to charge accumulated by the capacitance from the drain to the body.

4. A field effect transistor device having reduced second-order harmonic distortion, including:
   (a) a drain region, a source region, and a gate arranged on a body such that the gate modulates a conductive channel between the source region and the drain region; and
   (b) equalizing means coupled and configured to equalize the total capacitance from the source to the body with respect to the total capacitance from the drain to the body, the equalizing means including an added capacitive layer overlaying but insulated from the source region and the drain region, and directly coupled to the body and capacitively coupled to the source region and the drain region, wherein the added capacitive layer is arrayed symmetrically with respect to the X-Y axes of the field effect transistor device.

5. A method for reducing second-order harmonic distortion in field effect transistor devices, including:

(a) providing a field effect transistor device having a drain region, a source region, and a gate arranged on a body such that the gate modulates a conductive channel between the source region and the drain region; and (b) providing an added capacitive layer overlaying but insulated from the source region and the drain region, and directly coupled to the body and capacitively coupled to the source region and the drain region, and sized to set the total capacitance from the source region to the body to be essentially equal to the total capacitance from the drain region to the body, wherein the added capacitive layer is arrayed symmetrically with respect to the X-Y axes of the field effect transistor device.

6. A method for reducing second-order harmonic distortion in field effect transistor devices, including:

(a) providing a field effect transistor device having a drain, a source, and a gate arranged on a body such that the gate modulates a conductive channel between a source region and a drain region; and (b) providing a bias voltage source coupled between the source and drain and configured at a voltage level sufficient to counter-balance the difference in charge accumulated by the capacitance from the source to the body with respect to charge accumulated by the capacitance from the drain to the body.

* * * * *